(12) United States Patent
Schwalb

(10) Patent No.: US 10,816,978 B1
(45) Date of Patent: Oct. 27, 2020

(54) AUTOMATED VEHICLE ARTIFICIAL INTELLIGENCE TRAINING BASED ON SIMULATIONS

(71) Applicant: MSC.Software Corporation, Newport Beach, CA (US)

(72) Inventor: Edward Schwalb, Irvine, CA (US)

(73) Assignee: MSC.Software Corporation, Newport Beach, CA (US)

(*) Notice: Subject to any disclaimer, the term of this patent is extended or adjusted under 35 U.S.C. 154(b) by 329 days.

(21) Appl. No.: 15/902,894

(22) Filed: Feb. 22, 2018

(51) Int. Cl.
| | |
|---|---|
| *G05D 1/00* | (2006.01) |
| *G06F 30/23* | (2020.01) |
| *G06N 20/00* | (2019.01) |
| *G06T 11/00* | (2006.01) |
| *G05D 1/02* | (2020.01) |

(52) U.S. Cl.
CPC ......... *G05D 1/0088* (2013.01); *G05D 1/0246* (2013.01); *G06F 30/23* (2020.01); *G06N 20/00* (2019.01); *G06T 11/00* (2013.01)

(58) Field of Classification Search
None
See application file for complete search history.

(56) References Cited

U.S. PATENT DOCUMENTS

| | | | | |
|---|---|---|---|---|
| 10,146,225 B2* | 12/2018 | Ryan | ........................ | G06F 30/15 |
| 10,474,790 B2* | 11/2019 | Sun | ........................ | G06F 30/15 |
| 10,565,329 B2* | 2/2020 | Greenwood | ............ | G06F 30/20 |
| 2017/0103147 A1* | 4/2017 | Khanna | .................... | G06F 30/20 |
| 2018/0033221 A1* | 2/2018 | Zhai | ....................... | G05D 1/0246 |
| 2018/0233061 A1* | 8/2018 | Rozenberg | ............... | G09B 9/48 |
| 2019/0163181 A1* | 5/2019 | Liu | ......................... | G06F 30/15 |

OTHER PUBLICATIONS

Kapinski et al., "Simulation-Based Approaches for Verification of Embedded Control Systems: An Overview of Traditional and Advanced Modeling, Testing, and Verification Techniques", IEEE Control Systems Magazine, vol. 36 No. 6, Nov. 2016, pp. 45-64. (Year: 2016).*

Kim et al., "Testing Autonomous Vehicle Software in the Virtual Prototyping Environment", IEEE Embedded Systems Letters, vol. 9 No. 1, Dec. 2016, pp. 5-8. (Year: 2016).*

Dreossi et al., "Systematic Testing of Convolutional Neural Networks for Autonomous Driving", arXiv preprint arXiv:1708.03309, Aug. 2017, pp. 1-5. (Year: 2017).*

O'Kelly et al., "Computer-Aided Design for Safe Autonomous Vehicles", 2017 Resilience Week (RWS), Sep. 2017, pp. 90-96. (Year: 2017).*

* cited by examiner

*Primary Examiner* — Todd Melton
(74) *Attorney, Agent, or Firm* — Foley & Lardner LLP

(57) ABSTRACT

Examples described herein relate to apparatuses and methods for or simulating and improving performance of an artificial intelligence (AI) driver, including but not limited to generating sensor data corresponding to a virtual environment, generating a pixelated image corresponding to the virtual environment based on the sensor data, determining actuator commands responsive to pixels in the pixelated image, wherein the decision module determines the actuator commands based on the AI driver, and simulating behaviors of the ego vehicle object using the actuator commands.

30 Claims, 9 Drawing Sheets

AUTOMATED VEHICLE ARTIFICIAL INTELLIGENCE TRAINING BASED ON SIMULATIONS

CROSS-REFERENCE TO RELATED PATENT APPLICATION

This application is related to U.S. patent application Ser. No. 15/902,868, by Edward Schwalb, filed Feb. 22, 2018, which is incorporated herein by reference in its entirety.

BACKGROUND

An automated vehicle (AV) is any self-driving vehicle that is controlled, at least partially, by artificial intelligence (AI). Safety is undoubtedly a major focus for any AV developmental effort. Traditionally, road tests are implemented to test the safety of AI drivers that operate the AVs. However, at least a billion miles of road tests are required to be conducted to obtain sufficient sample size for observing failures, which may be rare. In order to discover particular points of failure, an additional hundreds of millions of miles are required. Furthermore, road tests need to cover a wide range of weather conditions, road conditions, unexpected behaviors of other road occupants (e.g., other cars, cyclists, pedestrians, and the like). In addition, previously performed road tests need to be re-performed after system revisions or updates to confirm that revisions and improvements do not have any unintended side-effects on previously validated aspects of the AI drivers. As such, actual road tests for AVs are impractical to be implemented effectively on a massive scale due to cost and time-consumption. Furthermore, it is not possible to compare performance of an AI driver in a given set of circumstances to performances of other AI drivers or to performances human drivers in the same set of circumstances, because reproducing the same set of circumstances in reality is nearly impossible to achieve.

SUMMARY OF THE INVENTION

In some arrangements, a simulation system for training an AI driver configured to operate an AV includes a memory and a processing circuit. The processing circuit is configured to implement a controlled system corresponding to an ego vehicle object associated with the AV. The controlled system includes a sensor module, a perception module, a decision module, and an actuator module. The sensor module generates sensor data corresponding to a virtual environment. The perception module generates a pixelated image corresponding to the virtual environment based on the sensor data. The decision module determines actuator commands responsive to pixels in the pixelated image. The decision module determines the actuator commands based on the AI driver. The actuator module simulates behaviors of the ego vehicle object using the actuator commands.

In some arrangements, a non-transitory computer-readable medium storing processor-readable instructions such that, when executed, causes a processor to train an AI driver configured to operate an AV by generating sensor data corresponding to a virtual environment, generating a pixelated image corresponding to the virtual environment based on the sensor data, determining actuator commands responsive to pixels in the pixelated image, and simulating behaviors of the ego vehicle object using the actuator commands. The actuator commands are determined based on the AI driver.

In some arrangements, a method for improving an AI driver in a simulated virtual environment includes generating pixelated images using sensor data corresponding to a virtual environment, storing result parameters of simulations involving the AI driver managing an ego vehicle object, organizing the result parameters into inputs and outputs, deriving a simplified model that reproduces the outputs based on the inputs, and applying the simplified model to perform subsequent simulations. The result parameters are generated based on the pixelated images.

In some arrangements, a simulation system for training an AI driver configured to operate an AV includes a memory and a processing circuit. The processing circuit is configured to generate pixelated images using sensor data corresponding to a virtual environment, store result parameters of simulations involving the AI driver managing an ego vehicle object, organize the result parameters into inputs and outputs, derive a simplified model that reproduces the outputs based on the inputs, and apply the simplified model to perform subsequent simulations. The result parameters are generated based on the pixelated images.

In some arrangements, a non-transitory computer-readable medium storing processor-readable instructions such that, when executed, causes a processor to train an AI driver configured to operate an AV by generating pixelated images using sensor data corresponding to a virtual environment, storing result parameters of simulations involving the AI driver managing an ego vehicle object, organizing the result parameters into inputs and outputs, deriving a simplified model that reproduces the outputs based on the inputs, and applying the simplified model to perform subsequent simulations. The result parameters are generated based on the pixelated images;

In some arrangements, a method for training an AI driver configured to operate an AV includes generating, by a sensor module, sensor data representing a virtual environment, generating, by a perception module, a pixelated image corresponding to the virtual environment based on the sensor data, determining, by a candidate actuator command sequence generator, a plurality of candidate actuator command sequences based on the pixelated image, predicting consequences associated with each of the plurality of candidate actuator command sequences through virtual simulations, and selecting an actuator command sequence from the plurality of candidate actuator command sequences based on the consequences associated with each of the plurality of candidate actuator command sequences. Each of the plurality of candidate actuator command sequences controls an ego vehicle object.

In some arrangements, a simulation system for training an AI driver configured to operate an AV includes a memory and a processing circuit, wherein the processing circuit is configured to generate sensor data representing a virtual environment, generate a pixelated image corresponding to the virtual environment based on the sensor data, determine a plurality of candidate actuator command sequences based on the pixelated image, predict consequences associated with each of the plurality of candidate actuator command sequences through virtual simulations, and select an actuator command sequence from the plurality of candidate actuator command sequences based on the consequences associated with each of the plurality of candidate actuator command sequences. Each of the plurality of candidate actuator command sequences controls an ego vehicle object.

In some arrangements, a non-transitory computer-readable medium storing processor-readable instructions such that, when executed, causes a processor to train an AI driver configured to operate an AV by generating sensor data representing a virtual environment, generating a pixelated image corresponding to the virtual environment based on the sensor data, determining a plurality of candidate actuator command sequences based on the pixelated image, predicting consequences associated with each of the plurality of candidate actuator command sequences through virtual simulations, and selecting an actuator command sequence from the plurality of candidate actuator command sequences based on the consequences associated with each of the plurality of candidate actuator command sequences. Each of the plurality of candidate actuator command sequences controls an ego vehicle object.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
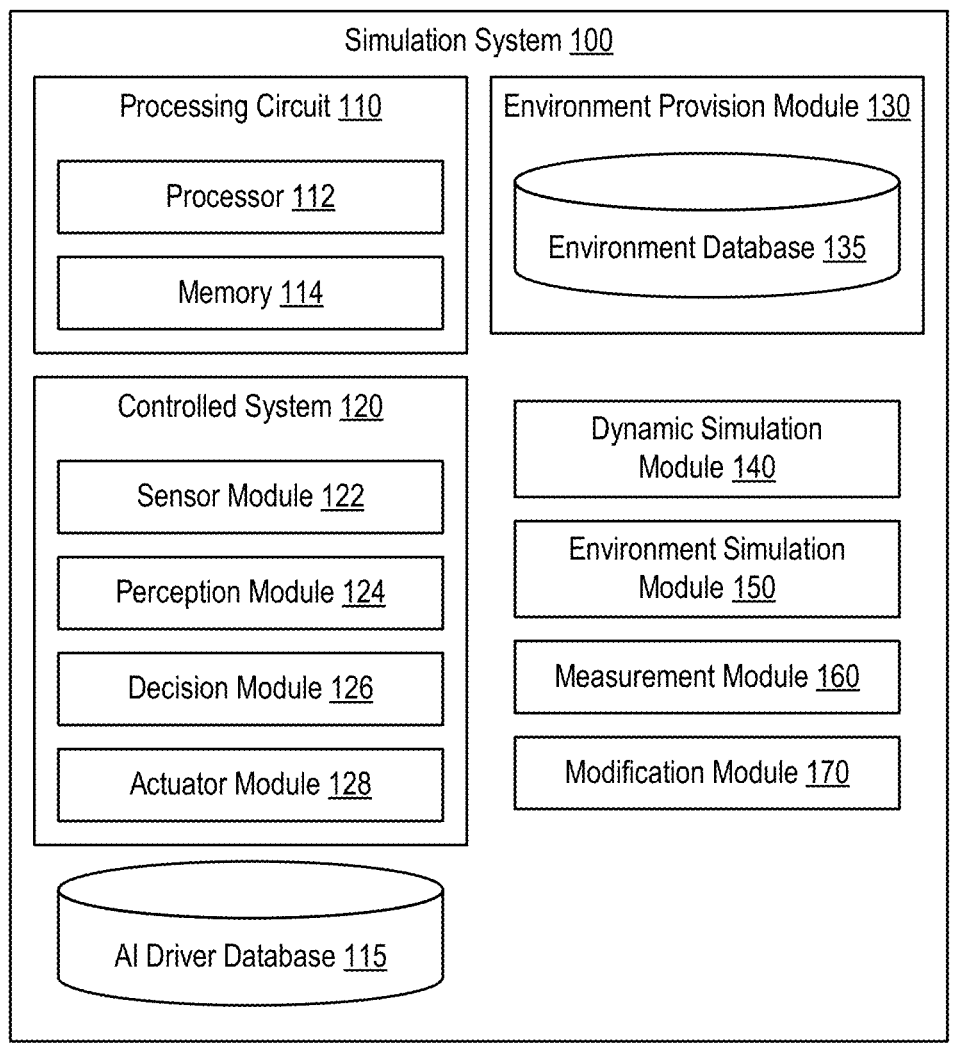
FIG. 1 is a block diagram illustrating an example of a simulation system for simulating and improving performance of an AI driver according to various arrangements.

The detailed description set forth below in connection with the appended drawings is intended as a description of various aspects of the present disclosure and is not intended to represent the only aspects in which the present disclosure can be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure can be practiced without these specific details. In some instances, structures and devices are shown in block diagram form in order to avoid obscuring the concepts of the present disclosure. Acronyms and other descriptive terminology can be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more aspects.

Referring generally to the FIGS., arrangements described herein relate to apparatuses, systems, and methods for performing computerized simulation to improve AI drivers. Some implementations use closed-loop reinforcement learning for performing simulations and improving AI drivers. The computerized simulation provides at-will control over a virtual environment, achieves fine-grained decomposition of any particular driving instruction, and produces a wide range of parameters for analysis. A computerized simulation simulates circumstances, conditions, and environmental factors that a physical AV may experience in the actual road test and can be executed much more quickly (at least a thousand times faster) than a corresponding actual road test. This is due to the fact that the computerized simulation can be sped up from real time. Thus, the speed at which the computerized simulations can be executed depends on the speed of computer software/hardware on which the computerized simulations are executed. Computerized simulations are also tremendously cheaper to run, without requiring AVs to actually move in the physical world. Furthermore, computerized simulations are safer, without endangering actual road occupants in the physical world.

As referred to herein, an "AI driver" is and includes a set of logic, algorithm, rules, instructions, codes, or a combination thereof that controls the manner in which an AV moves. In the context of the physical world, the AV driver can instruct the AV to move based on sensor data originating from various sensors such as but not limited to, Global Positioning System (GPS), Light Detection and Ranging (LiDAR), radar, ultrasound sensor, camera, image sensor, wireless communication devices, and the like. In other words, a computer system of the AV can send actuation commands to an engine, transmission, steering, a gas tank, brakes, signal lights, and other components of the AV in accordance with decisions of the AI driver.

In the context of computer simulations, an AI driver can be stored in a memory unit and invoked as an input to the computerized simulations. The AI driver can govern how a simulated AV object (referred to herein as an "ego vehicle object") moves within a simulated, virtual environment. The sensor data can be simulated to enable virtual perception of the simulated, virtual environment. The simulated sensor data is provided to the AI driver for the AI driver to generate driving decisions or actuator commands in the computerized simulations.

FIG. 1 is a block diagram illustrating an example of a simulation system 100 according to various arrangements. Referring to FIG. 1, the simulation system 100 includes at least a processing circuit 110, an AI driver database 115, a controlled system 120, an environment provision module 130, a dynamic simulation module 140, an environment simulation module 150, a measurement module 160, and a modification module 170 to implement features described herein.

The processing circuit 110 can be part of a workstation computer or other suitable types of computing device. The various circuits or modules 120-170 for executing the various functions described herein can be implemented by the processing circuit 110 or another suitable processing unit. The processing circuit 110 includes a processor 112 and a memory 114.

The processor 112 includes any suitable data processing device, such as a general-purpose processor (e.g., a microprocessor). In the alternative, the processor 112 can be any conventional processor, controller, microcontroller, or state machine. The processor 112 can be implemented as a combination of computing devices, e.g., a combination of a Digital Signal Processor (DSP) and a microprocessor, a plurality of microprocessors, at least one microprocessor in conjunction with a DSP core, or any other such configuration. For example, the processor 112 can be but is not limited to being, an Intel® designed processor, AMD® designed processor, Apple® designed processor, QUALCOMM® designed processor, or ARM® designed process.

The memory 114 (or storage device) can be operatively coupled to the processor 112 and can include any suitable device for storing software instructions and data for controlling and use by the processor 112 to perform operations and functions described herein. Examples of the memory 114 include but are not limited to, Random Access Memory (RAM), Read Only Memory (ROM), floppy disks, hard disks, dongles or other Recomp Sensor Board (RSB) connected memory devices, or the like. The memory 114 can include non-transitory storage media that is configured to store information and instructions pertinent to the operation of the processor 112.

The memory 114 can send data to or receive data from the processor 112 and/or each of the circuits/components 120-170 in the simulation system 100. In some examples, the memory 114 can be a remote storage device that stores data for the simulation system 100 (or only the processing circuit 110) in a different node of a network than that on which the processing circuit 110 and/or the simulation system 100 reside. In other examples, the memory 114 can be located on the same computer system (e.g., within the same node of the network) as the processing circuit 110 and/or the simulation system 100. In other examples, one or more of the circuits 120-140 can be implemented with a dedicated memory unit that is separate from the memory 114.

The controlled system 120 refers to a virtual, simulated system under control by an AI driver. In that regard, the controlled system 120 is an ego vehicle object, which can be an object, module, or element in a virtual environment. The AI driver database 115 stores AI drivers including but not limited to, different AI drivers, and different versions of a same AI driver, and the like. The AI drivers stored in the driver database 115 can be called to control the controlled system 120. The controlled system 120 includes at least a sensor module 122, a perception module 124, a decision module 126, and an actuator module 128.

The sensor module 122 generates simulated sensor data in order to simulate actual sensors generating actual sensor data during a road test. For example, the simulated sensor data includes but is not limited to, pictures, videos, LIDAR data, GPS data, infrastructure communication data, and the like. Thus, the sensor module 122 is configured to output simulated sensor data corresponding to different types of sensors. The simulated sensor data is in the same formats as those of the actual sensor data produced by actual sensors. Sensor data formats and protocols can change overtime due to innovation.

In some arrangements, the sensor module 122 is configured to receive simulated environmental data from the environment provision module 130. The sensor module 122 converts the simulated environmental data to simulated sensor data. An example of the simulated environmental data includes a position, size, and velocity of a dynamic object other than the ego vehicle object. The sensor module 122 can convert the simulated environmental data of the dynamic object into videos and LiDAR data that correspond to the position, size, and velocity of the dynamic object, as if cameras and LiDAR systems are capturing data for an actual object having the same position, size, and velocity. In other arrangements, the sensor module 122 receives the simulated sensor data directly from the environment provision module 130.

The perception module 124 uses the simulated sensor data or physical sensor data as input and generates a pixelated image. For example, the perception module 124 can determine various factors such as but not limited to, a velocity of the ego vehicle object, distance from the ego vehicle object to at least one traffic participant object (static or dynamic), relative velocity to at least one traffic participant object, traffic indicators, and the like based on the simulated or physical sensor data. Such parameters are used to formulate the pixelated image in the manner described. In some arrangements, a portion of the two-dimensional pixelated image can be generated from a list of numbers, which is one-dimensional. For example, a number indicative of a velocity of the ego vehicle object or a dynamic object in the simulation can be translated to a depiction of a two-dimensional indicator (e.g., a bar having a dimension 100-by-10 pixels). An equivalent list can be used when a large number of frames are present.

Figure 3:
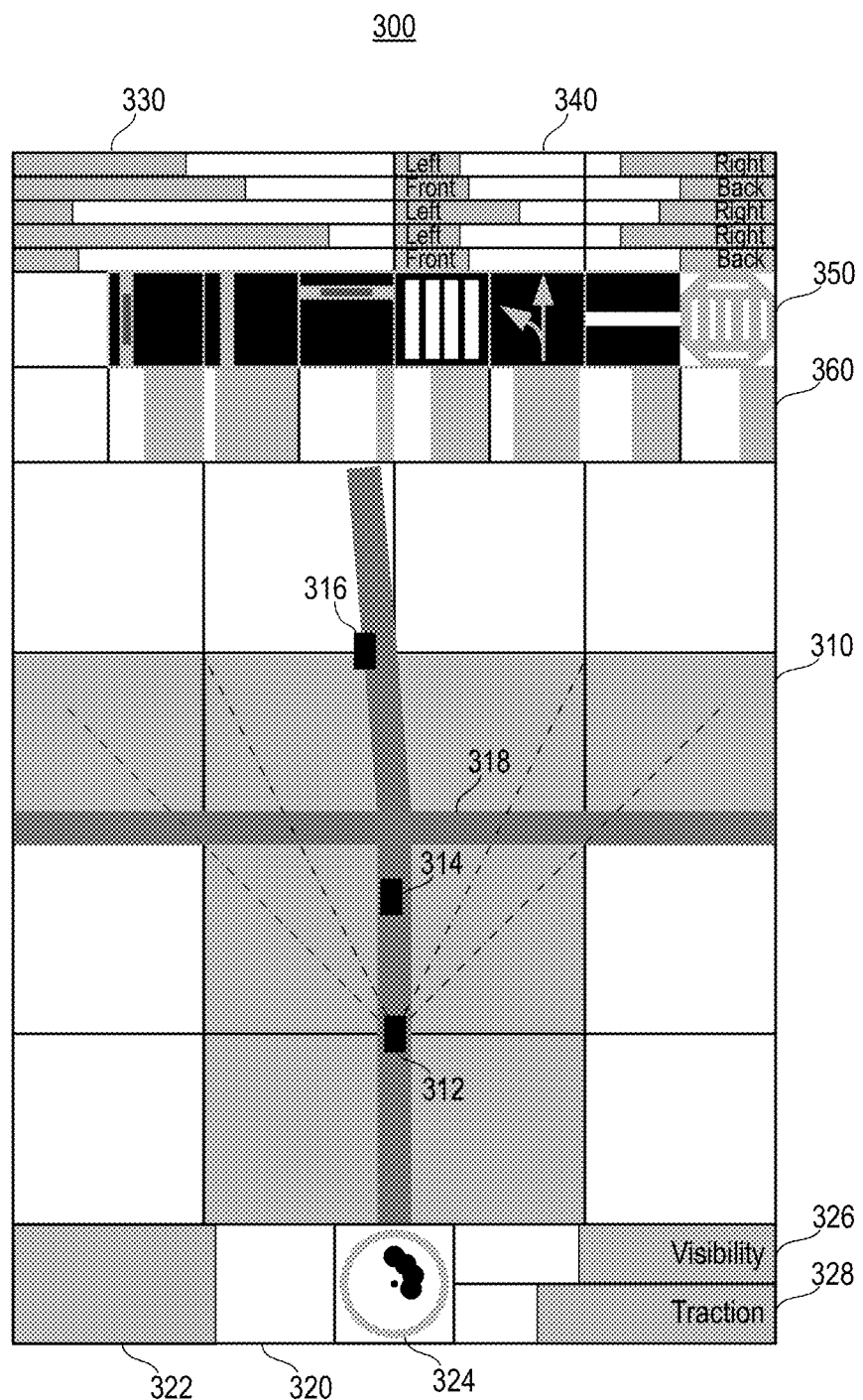
FIG. 3 is an example of a pixilated dashboard according to some arrangements.

In some arrangements, the pixelated image has a pixelated dashboard design. A non-limiting example of the pixelated dashboard design is illustrated in FIG. 3. In some arrangements, the pixelated image includes at least a 2D representation of roads, terrain, the ego vehicle object, other traffic participant objects, static objects, dynamic objects, and the like as created in the simulated environment. The pixelated image can further include pixelated graphical depictions of at least one of a static temporal clearance parameter, a dynamic temporal clearance parameter, traffic indicators, the simulated sensor data (e.g., velocity, visibility, traction, and weather information), metrics, and alerts. The traffic indicators include but are not limited to, traffic lights, stop signs, road markings, speed limits, parking indicators, and the like. The metrics include but are not limited to, a safety quotient, a path tracking parameter, a comfort parameter, a fuel economy parameter, a duration of drive parameter, and the like.

Pixelated images can be periodically generated for a given simulation. For a simulation that runs for a simulated duration, multiple pixelated images (e.g., each of which is referred to herein as a "frame") can be generated at different points in time within the simulation duration. The simulated duration can be defined by simulation run time or scenario time. The scenario time is the time it takes for an actual AV to perform the maneuvers that the ego vehicle object performs in the simulation. The simulation run time is the time it takes to run the simulation. The simulation can be sped up from scenario time to promote processing efficiency. Thus, the scenario time can be the same as or longer than the simulation run time.

Given that objects in the simulated environment may move or change over time, each frame for a simulation may be different and include different information. The information included in a particular frame is used as a basis for the decision module 126 to generate actuator commands at the time that the frame is generated. In some arrangements, the periodicity of the frames can be based on sampling periods of actual sensors simulated by the sensor module 122. For example, the periodicity of the frames can be a common denominator of sampling periods of all simulated sensor data generated by the sensor module 122. In a case in which the sensor module 122 simulates two sensors with sampling periods of 2 ms and 4 ms, a frame is generated every 4 ms. In other examples, the periodicity of the frames may be independent of the sampling periods of the sensors.

The decision module 126 determines actuator commands responsive to and based on pixels in the pixelated image. The decision module 126 is or includes the AI driver. The actuator commands can govern how the ego vehicle object moves, by instructing a motor (acceleration and velocity control), steering (direction), brake (deceleration), and the like to perform one or more operations.

Table 1 illustrates exemplary input and output of the perception module 124 and the decision module 126.

TABLE 1

|  | Perception Module | Decision Module |
| --- | --- | --- |
| Input | Simulated Sensor Data | Pixelated Image |
| Output | Pixelated Image | Actuator Command |

In some arrangements, the AI drivers may need to be virtually trained with rich experiences over billions of miles based on existing sensor technologies and protocols. Thus, it may be costly to retrain the decision module 126 as sensor technologies are updated due to lack of compatibility with new sensor formats and protocols. Using the pixelated dashboard instead of directly using the simulated sensor data as an input for the decision module 126 confers various advantages including but not limited to, using the pixelated dashboard as an intermediary between the simulated sensor data and the decision module 126. This allows standardization of the different types of sensors and the different formats used by those sensors, such that the decision module 126 (e.g., the AI driver) can generate actuator commands based on a known data format (e.g., the pixelated image format) of the pixelated dashboard. To update the simulation system 100 to be compatible with new sensor formats or protocols, one merely needs to update the perception module 124 to generate the pixelated dashboards using the new sensor formats or protocols. The AI driver used to implement the decision module 126 does not need to be changed. In some arrangements, the AI driver is a driver that produces an output actuator command, or a candidate actuator command, based on an input of the state of the AV, as provided by the output of the perception module 124.

The actuator module 128 simulates behaviors of the ego vehicle object based the actuator commands. For example, the actuator module 128 controls the virtual motor, virtual steering, and virtual brake of the ego vehicle object to in order to control the movement of the ego vehicle object. In other words, the actuator module 128 determines motion of the ego vehicle object by virtually actuating the actuator commands.

The environment provision module 130 is configured to select and load a virtual environment based on which a computerized simulation is performed. The environment database 135 can store various virtual environments, each corresponds to a "risk scenario"—the computerized simulations can virtually simulate the circumstances and the environmental factors that may exist in actual road tests as realistic as possible. In one example, a risk scenario is turning left at an intersection that is managed by a traffic light and occupied by pedestrians and other vehicles.

The dynamic simulation module 140 is configured to determine a first predicted consequence parameter indicative of consequences of the actuator commands on the ego vehicle object, as the ego vehicle object is being controlled by the actuator module 128. The environment simulation module 150 is configured to determine a second predicted consequence parameter indicative of consequences of the actuator commands on the virtual environment. In some arrangements, the dynamic simulation module 140 and the environment simulation module 150 are combined into a single module that predicts both the consequences on the ego vehicle object and the consequences on the virtual environment. In other arrangements, the modules 140 and 150 are separate modules.

The measurement module 160 is configured to determine an overall predicted consequence parameter based on the first predicted consequence parameter and the second predicted consequence parameter. This is used to evaluate the performance of the AI driver.

The modification module 170 is configured to modify the AI driver to improve the overall predicted consequence parameter. The modified AI driver is put into the same simulated environment or another simulated environment to further execute a workflow, in a closed-loop, reinforced manner.

Figure 2:
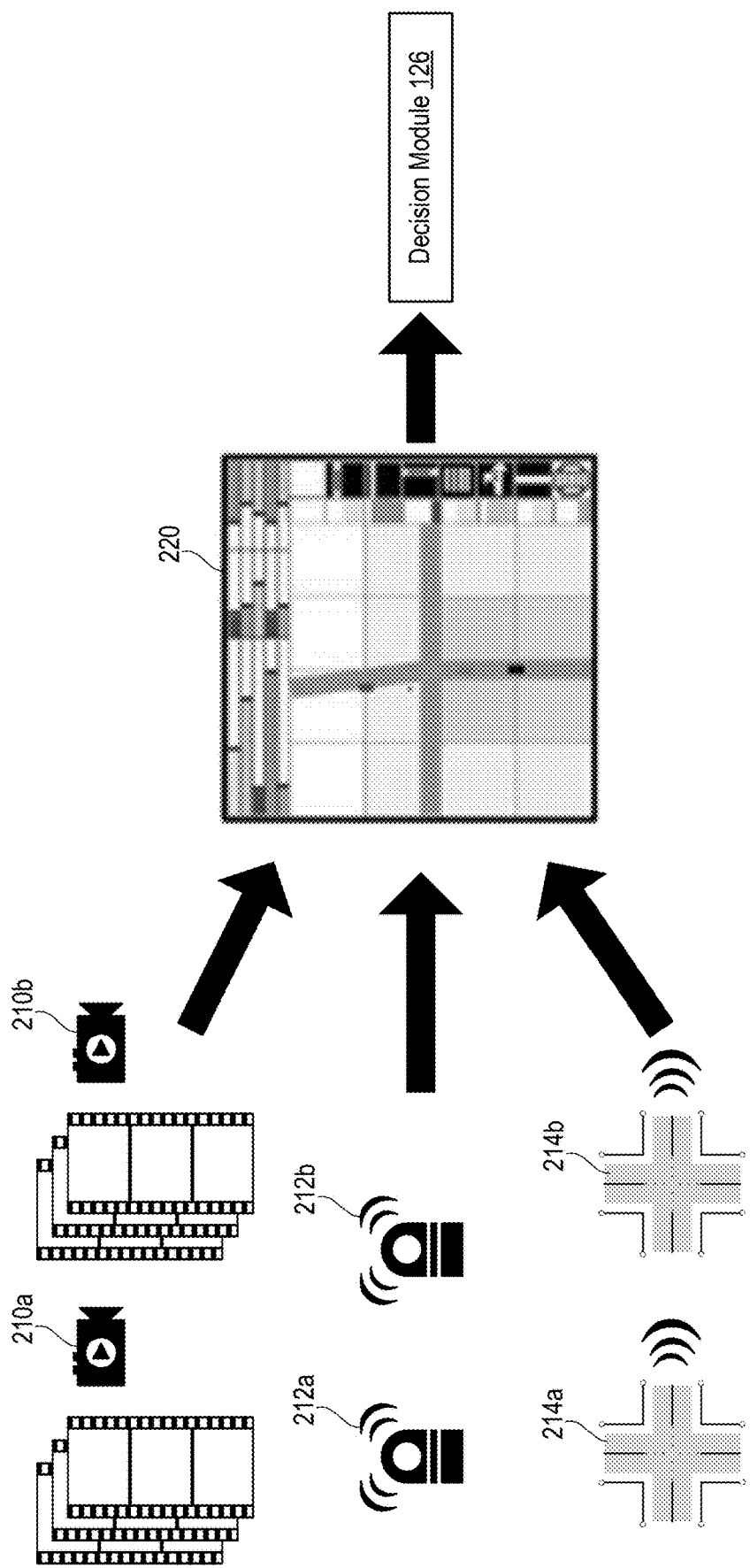
FIG. 2 is a process flow diagram illustrating a workflow for training AI drivers according to various arrangements.

FIG. 2 is a process flow diagram 200 illustrating a workflow for training AI drivers according to various arrangements. Referring to FIGS. 1-2, simulated sensor data 210a, 210b, 212a, 212b, 214a, and 214b are generated by the sensor module 122. The simulated sensor data 210a, 210b, 212a, 212b, 214a, and 214b can be used as inputs to the perception module 124. The simulated video data 210a and 210b represents outputs from two virtual cameras installed at different locations on the ego vehicle object. Thus, the simulated video data 210a and 210b may correspond to different field of views (FOVs) and/or different frame rates. The simulated LiDAR data 212a and 212b represents outputs from two LiDARs installed at different locations on the ego vehicle object. The simulated infrastructure communications data 214a and 214b represent data communications received from two separate infrastructure communication stations or beacons.

The perception module 124 generates a pixelated dashboard 220 based on the simulated sensor data 210a, 210b, 212a, 212b, 214a, and 214b. For example, using the simulated video data 210a and 210b and the simulated LiDAR data 212a and 212b, the perception module 124 can determine velocity, position, and size of other objects in the simulation. Using the simulated infrastructure communications data 214a and 214b, the perception module 124 can determine traffic indicators for the simulated road on which the ego vehicle object is moving. The pixelated dashboard 220 can be sent to the decision module 126 (the AI driver), which uses the pixelated dashboard 220 for generating actuator commands.

FIG. 3 is an example of a pixilated dashboard 300 according to some arrangements. Referring to FIGS. 1-3, the pixilated dashboard 300 can be a non-limiting implementation of the pixelated dashboard 220. The pixilated dashboard 300 is a pixelated image including a traffic component 310, a status component 320, a metrics component 330, a spatial clearance component 340, a regulation component 350, and a temporal clearance component 360.

The traffic component 310 refers to an area on the pixilated dashboard 300 that graphically portrays the simulated environment as provided by the environment provision module 130. In one example, the traffic component 310 is generated using simulated sensor data indicative of spatial information (e.g., distance, velocity, acceleration, and the like) of an ego vehicle object 312 and other objects (e.g., a first object 314 and a second object 316). In that regard, at least videos and LiDAR data can be used to generate the traffic component 310. In the traffic component 310, each cell is 50×50 pixels. The traffic component 310 has area of 200×200 pixels. The traffic component 310 shows a pixelated graphical depiction of the ego vehicle object 312, the first object 314, and the second object 316. The traffic component 310 may also display a pixelated graphical depiction of roads 318.

The sizes of the objects 312, 314, and 318 can be presented using class-based approximations. Illustrating with non-limiting examples, a pedestrian has a size of 4×4 pixels, a motor/cyclist has a size of 6×4 pixels, a car has a size of 8×4 pixels, a light truck has a size of 12×4 pixels, a heavy truck has a size of 16×6 pixels, a bus has a size of 20×8 pixels, and a trailer truck has a size of 32×8 pixels. One of ordinary skill in the art can appreciate that other class-based approximations can be used. Using the simulated sensor data as input, the perception module 124 can determine the size of each detected object. For each detected object that appear like a vehicle, the perception module 124 can select a pixel representation that corresponds to the size of detected object.

The spatial relationship as depicted in the traffic component 310 is indicative of the spatial relationship in the simulated environment. In one example in which analysis of the simulated sensor data reveals that the first object 314 is x m away from the ego vehicle object 312, the traffic component 310 shows that the first object 314 is y pixels away from the ego vehicle object 312. The relationship between x and y can be characterized as y=A·x, where A is a scaling factor. Thus, the pixilated representation in the traffic component 310 retains the spatial relationship between the ego vehicle object 312 and other objects 314 and 316. By determining the distance in units of pixels between two objects in the traffic component 310, the decision module 126 can determine simulated distance between those two objects and generate actuator commands accordingly. In one example, the decision module 126 merely needs to multiply the distance between the objects in pixels by the scaling factor to determine the simulated distance between those to objects.

The status component 320 refers to area on the pixilated dashboard 300 that graphically portrays statuses of the ego vehicle object 312 and the simulated environment. The status component 320 is 200×30 pixels. The status component 320 includes a speed indicator 322, an alert indicator 324, a visibility indicator 326, and a traction indicator 328.

The speed indicator 322 is a pixelated graphical depiction of the speed of the ego vehicle object 312. The speed is controlled by the actuator module 128 (through controlling of one or more of a virtual gas pedal, virtual transmission, and a virtual brake pedal) and therefore is known by the actuator module 128. The perception module 124 can translate a list of numbers representative of the speed of the ego vehicle object 312 into a pixelated graphical depiction (e.g., the speed indicator 322). The speed indicator 322 is a bar having a maximum dimension of 85×30 pixels.

The perception module 124 can determine numbers for visibility and traction based on the simulated sensor data. Similarly, the perception module 124 can translate a list of numbers representative of the visibility and traction into pixelated graphical depictions (e.g., the visibility indicator 326 and the traction indicator 328). Each of the visibility indicator 326 and the traction indicator 328 is a bar having a maximum dimension of 85×15 pixels. Indicators for other parameters such as but not limited to, weather information can be likewise included.

The alert indicator 324 is a pixelated graphical depiction of illegal or unpermitted actions performed by the ego vehicle object 312. In an example, simulated traffic laws and regulations include a speed limit in the simulated environment. The speed limit is virtually communicated to the ego vehicle object 312 through simulated infrastructure communications data. The dynamic simulation module 140 can determine that the speed of the ego vehicle object 312 exceeds the speed limiting. The perception module 124 adds the alert indicator 324 corresponding to the illegal or unpermitted action (e.g., speeding) to the status component 320. The alert indicator 324 has a size of 30×30 pixels.

The metrics component 330 refers to area on the pixilated dashboard 300 that graphically portrays metrics such as but not limited to, a safety quotient, a path tracking parameter, a comfort parameter, a fuel economy parameter, a duration of drive parameter, and the like. Such parameters can be determined by one or more of the dynamic simulation module 140 and the environment simulation module 150. Such parameters can be determined using various suitable methods, a few of which are disclosed in Ser. No. 15/902,868, titled "Automated Vehicle Safety Simulation Using Safety Quotients", filed Feb. 22, 2018, which is incorporated herein by reference in its entirety. The metrics component 330 has a dimension of 100×75 pixels. Each metric indicator is a bar having a maximum dimension of 100×15 pixels. The perception module 124 can translate a list of numbers representative of the metric parameters into pixelated graphical depictions (e.g., the bars shown in the metrics component 330).

The spatial clearance component 340 refers to area on the pixilated dashboard 300 that graphically portrays spatial clearance that the ego vehicle object 312 has with respect to each object in the simulated environment. Examples of the object include but are not limited to, a curb, the object 314, the object 316, and the like. The spatial clearance component 340 is 100×75 pixels. Each spatial clearance indicator is a bar having a maximum dimension of 50×15 pixels. The spatial clearance refers to a distance between the ego vehicle object and the object of interest. The spatial clearance indicators can be defined using relative directions such as left, right, front, back of the ego vehicle object 312.

The regulation component 350 refers to area on the pixilated dashboard 300 that graphically portrays traffic laws and regulations included the simulated environment. The regulation component 350 can display law and regulation indicators or traffic indicators pertinent to the roads 318. Examples of the traffic indicators include but are not limited to, traffic lights, stop signs, road markings, speed limits, parking indicators, and the like. The simulated sensor data based on which the traffic indictors can be determined include but is not limited to simulated infrastructure communications data and video data. The regulation component 350 is 200×25 pixels. Each traffic indicator is 25×25 pixels.

The temporal clearance component 360 refers to area on the pixilated dashboard 300 that graphically portrays temporal clearance that the ego vehicle object 312 has with respect to each object in the simulated environment. Such parameters can be determined by one or more of the dynamic simulation module 140 and the environment simulation module 150. Such parameters can be determined using various suitable methods, a few of which are disclosed in Ser. No. 15/902,868, titled "Automated Vehicle Safety Simulation Using Safety Quotients", filed Feb. 22, 2018, which is incorporated herein by reference in its entirety. The temporal clearance component 360 is 200×15 pixels. Each temporal clearance indicator is a bar having a maximum dimension of 25×15 pixels. The perception module 124 can translate a list of numbers representative of the temporal clearance parameters into pixelated graphical depictions (e.g., the bars shown in the temporal clearance component 360).

Various components 322, 326, 328, 330, 340, and 360 graphically present values, for example, using bars having a maximum dimension in terms of pixels. Longer length of the bar corresponds to greater value. Each of those indicators is graphically presented using a background color and a foreground color, with the foreground color representing the values and the background color representing the maximum values. In some arrangements, a 64-bit word can be used to implement a 1-Hot encoding for a length of a bar. For example, a value of 50% of the maximum can be displayed by activating only the 31st bit. A value of 25% of the maximum can be displayed by activating only the 15th bit.

In one example, for each indicator in components 350, a 25×25 pixels icon (having 625 RGB pixels, i.e., 1875 bytes) can be replaced with a single 32-bits word, with all other bits set to zero except i-th bit corresponding to the icon currently being depicted. Thus, replacing a 25×25 pixel icons with a 32-bit word results in a size reduction of greater than 500 times.

The dimensions, layout, and types of information included in the pixilated dashboard 300 are for illustrative purposes. One of ordinary skill in the art can appreciate that other dimensions, layouts, and types of information can be likewise included. In some arrangements, the layout or template for the pixilated dashboard 300 remains the same even if sensor data formats change over time. This allows the decision module 126 to analyze pixelated dashboards having the same layout or template such that the decision module 126 can extract information from the pixelated dashboards even if sensor data formats have changed.

Figure 4:
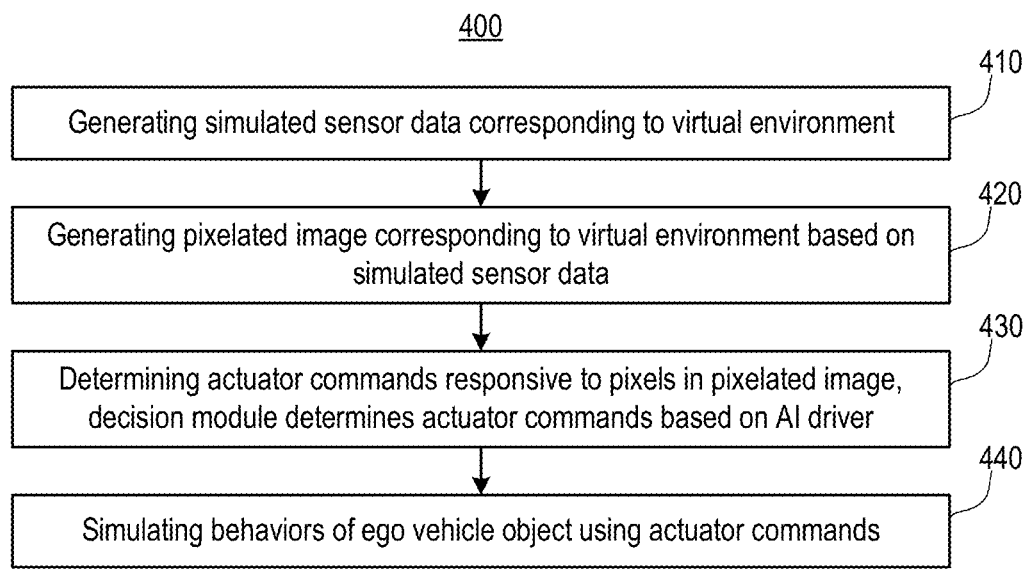
FIG. 4 is a process flow diagram illustrating an example of a method for simulating and improving performance of an AI driver according to various arrangements.

FIG. 4 is a process flow diagram illustrating an example of a method 400 for simulating and improving performance of an AI driver according to various arrangements. Referring to FIGS. 1-4, the method 400 can be performed by various components of the simulation system 100. At 410, the sensor module 122 generates simulated sensor data corresponding to a virtual environment. At 420, the perception module 124 generates a pixelated image corresponding to the virtual environment based on the simulated sensor data. Examples of the pixelated image include but are not limited to the pixilated dashboards 220 and 300. At 430, the decision module 126 determines actuator commands responsive to pixels in the pixelated image. The decision module 126 determines the actuator commands using the AI driver. At 440, the actuator module 128 simulates behaviors of the ego vehicle object using the actuator commands.

Figure 5:
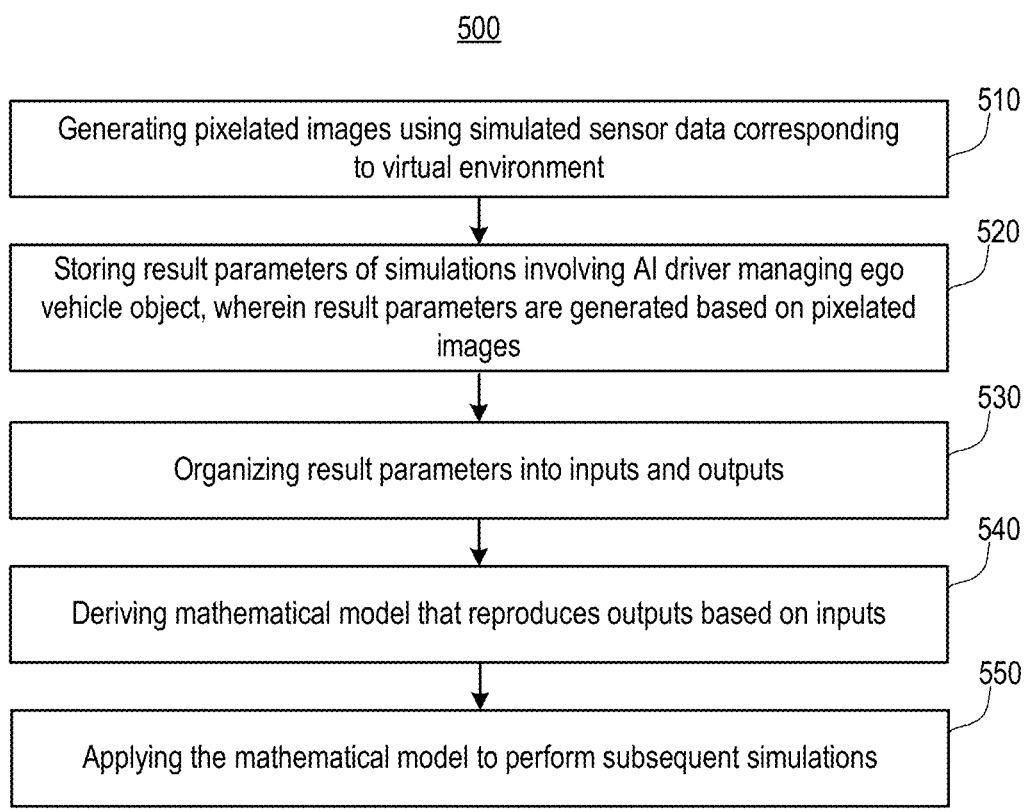
FIG. 5 is a process flow diagram illustrating an example of a method for simulating and improving performance of an AI driver according to various arrangements.

FIG. 5 is a process flow diagram illustrating an example of a method 500 for simulating and improving performance of an AI driver according to various arrangements. Referring to FIGS. 1-5, the method 500 can be performed by various components of the simulation system 100. In some arrangements, the simulation system 100 can implement or facilitate model-based result parameters of the simulations described herein involving an AI driver. The result parameters refer to the overall predicted consequence parameter, the predicted consequence parameter, the second predicted consequence parameter, or any other parameter obtained as result of the simulations. The result parameters are generated based on pixelated images in the manner described.

At 510, the perception module 124 generates pixelated images (e.g., the pixilated dashboards 220 and 300) using simulated sensor data corresponding to a virtual environment. At 520, the storing result parameters of simulations involving the AI driver managing an ego vehicle object. The result parameters are generated based on the pixelated images.

At 530, the result parameters are organized into inputs and outputs. Examples of inputs include actuator commands such as but are not limited to, steering manipulation as controlled by the actuator module, acceleration pedal manipulation as controlled by the actuator module, and deceleration pedal manipulation as controlled by the actuator module. Examples of outputs include impact parameters on the ego vehicle object, such as but are not limited to, chassis acceleration as detected by the dynamic simulation module, velocity of the ego vehicle object as detected by the dynamic simulation module, and displacement of the ego vehicle object as detected by the dynamic simulation module.

At 540, a simplified model that reproduces the outputs based on the inputs is derived. A simplified model can predict the impact to the ego vehicle object based on the actuator commands to speed up the simulation from real time. For example, a simplified model can be used to predict the acceleration, velocity, position, and other aspect of the vehicle based on the actuator commands. A speedup of greater than 100 times can be achieved using the simplified model. Suitable simplified models that approximate state-of-the-art vehicle dynamics simulation such as but not limited to, Automated Dynamic Analysis of Mechanical Systems (ADAIVIS™) made by MSC Software Corporation. The accelerated prediction using the simplified models can allow prediction of acceleration, velocity, and position of the ego vehicle object more than 5000 times per virtual mile, for over a billion virtual miles.

In some examples, deriving the simplified model includes performing a Finite Element Method (FEM) analysis using discretized material properties of at least one of a vehicle represented by the ego vehicle object and a human passenger. The FEM analysis computes injury parameters to the human passenger. The discretized material properties can be visualized as images and outputted to an operator by the simulation system 100. In another example, deriving the simplified model includes performing a FEM analysis to compute distortion to the ego vehicle object due to additive manufacturing. In yet another example, deriving the simplified model includes performing a flexible body analysis on a vehicle represented by the ego vehicle object.

In some arrangements, deriving the simplified model further includes automatically selecting a kernel method from a plurality of kernel methods for deriving the simplified model. A model from a plurality of models is automatically selected based on simulation criteria. The simplified model can be derived using Mixture of Experts.

At 550, the simplified model is applied subsequent simulations. In other words, the simplified model can be applied to predict results of subsequent simulations.

Traditional simulators predict a future state (from a current state) by solving differential equations stored in a model. The present arrangements relate to learning simplified models, which can be learned from training examples and without solving such differential equations. The resulting trained simplified models can compute approximations of future states (from a current state) about 10 to 1000 times faster than solving the differential equations, even on the same hardware. The improvement to computational efficiency can be derived from the fact that the number of steps required to perform predictions by solving differential equations, for example, with a Body-Dynamics (MBD) simulator (e.g., Adams™) is at least ten times greater than the number of steps required to make prediction using a learned simplified model. A standard learned simplified model can be a Random Forest, a Support Vector Machine w/Kernels, a Single/Multi-Layer-Perceptron, a Neural Network, Weighted Sum (e.g., learned using ridge regression), and other types of models. Learned simplified models can be further combined using Boosting, Bagging and Stacking, and other machine learning methods.

The purposes of a simulator include predicting a future state of for environment based on a current state of the environment. A MBD simulator compiles a model into differential equations. When plugging values corresponding to a current state within these equations, the MBD simulator can determine the predicted state by solving those differential equations for the unknown variables representing future state. The role of AI simplified models is similar: given the current state as input, AI models determine the predicted state as the output. In order for the learning algorithm to determine the predicted state, the learning algorithm needs to be provided with examples of current states and corresponding future states. Such examples are available in log files of, for example, the MBD simulator, or data recorded from a physical vehicle driving on a test track. For example, the log file contains values of the variables for all time points during an experiment. For each time point, such data provides pairs specifying the value of current state, followed by the value for the subsequent future state (determined based on simulations in the manner described). For each time point, combining the pair of values for a current state with the values for a subsequent state produces a single training example. For an experiment with 1000 time points, such data provides 999 training examples, because the last time point does not have a subsequent time point and thus cannot be paired.

In some arrangements, a log file can be a table. Columns in the table can represent positions, orientations, velocity, and the like in 3-dimensional space. For example, columns in the table can correspond to position x, position y, position z, orientation a, orientation (3, orientation velocity x, velocity y, and velocity z. Each row represents a time step, which relates to an increment of time at which the AV is in the position, orientation, and velocity indicated by the columns. The duration of that time step is configurable by the user. When training AI on those logs, the duration of the time step should be managed appropriately. In one example, a training example includes a current state (e.g., x, y, and z values) at time t and a predicted state (e.g., x, y, and z values) at time t+10 ms, where 10 ms equals to a known number of time steps. As such, in a single training set, examples with the same Δt (defined by a known number of time steps according to the table) between the current state and the predicted state can be compared.

In some arrangements, a number of log files corresponding to the results parameters stored can be limited. The simulation system 100 can thus reduce storing and logging costs. For example, a number of log files corresponding to the results parameters stored can be limited to a threshold. Changes to the simplified models determined can also have an impact to the number of log files. The impact (e.g., a delta) indicative of the change may be determined. The impact to the number of log files due to a change in the simplified model can be determined.

Figure 6:
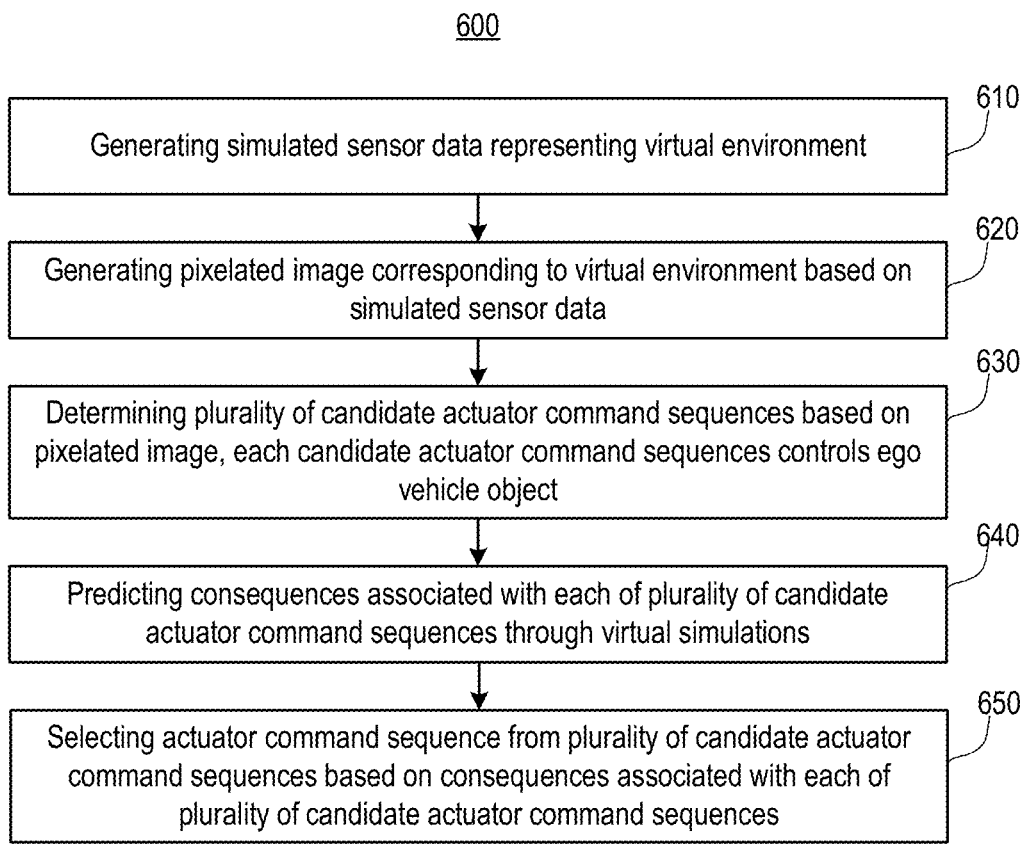
FIG. 6 is a process flow diagram illustrating an example of a method for simulating and improving performance of an AI driver according to various arrangements.

FIG. 6 is a process flow diagram illustrating an example of a method 600 for simulating and improving performance of an AI driver according to various arrangements. Referring to FIGS. 1-6, the method 600 can be performed by various components of the simulation system 100. In some arrangements, the decision module 126 includes or otherwise implements a candidate actuator command sequence generator configured to determine multiple candidate actuator command sequences. Each candidate actuator command sequence relates to manipulation of steering, acceleration pedal, and deceleration pedal by the actuator module 128. Each candidate actuator command sequence controls an ego vehicle object differently than others.

At 610, the sensor module 122 generates simulated sensor data representing a virtual environment. At 620, the perception module 124 generates a pixelated image (e.g., the pixilated dashboards 220 and 300) corresponding to the virtual environment based on the simulated sensor data.

At 630, the candidate actuator command sequence generator of the decision module 126 determines a plurality of candidate actuator command sequences based on the pixelated image. Each of the plurality of candidate actuator command sequences controls the ego vehicle object.

At 640, the consequences associated with each of the plurality of candidate actuator command sequences are predicted through virtual simulations by the decision module 126. For example, the dynamic simulation module 140 includes a control system simulator. The control system simulator can determine consequences on the ego vehicle object due to each candidate actuator command sequence. In another example, the environment simulation module 150 includes an environment simulator. The environment simulation module 150 can determine consequences on the virtual environment due to each candidate actuator command sequence. The decision module 126 can receive the consequences determined by the dynamic simulation module 140 and the environment simulation module 150 in some arrangements. In other arrangements, the decision module 126 includes the dynamic simulation module 140 and the environment simulation module 150. In some arrangements, the virtual simulations are performed by learning reduced order models or performed using error-models associated with physical sensors.

At 650, an actuator command sequence is selected, by the decision module 126, from the plurality of candidate actuator command sequences based on the consequences associated with each of the plurality of candidate actuator command sequences. In some arrangements, a level of confidence for the consequences on the virtual environment based on uncertainties in the virtual environment can be determined. In some arrangements, factors present in the virtual environment can be used to evaluate accuracy of the simulated sensor data as received by the sensor module 122. In some arrangements, parameterization of the virtual environment can be determined. The parameterization include, for example, quantifying road traction and other parameters.

The decision module 126 selects one of the candidate actuator command sequences based on the consequences associated with each candidate actuator command sequence. The decision module 126 may include a consequence measurement module that measures desirability associated with the consequences associated with each candidate actuator command sequence assuming that each candidate actuator command sequence is actually implemented. The decision module 126 includes a command sequence selection module that selects one or more of the candidate actuator command sequences having the most desirability. Desirability can be measured using at least one of a safety quotient, a path tracking parameter, a comfort parameter, a fuel economy parameter, a duration of drive parameter, and the like.

In some arrangements, the selection can be executing by first ranking the candidate actuator command sequences by the desirability of the consequences associated thereof. A data structure (e.g., a tree) is created to minimize backtracking. Sequences that share a large number of subsequences can be grouped. "Large" is defined by a threshold. One of the candidate actuator command sequences is selected, for example, using a Monte Carlo Tree Search (MCTS) based on the tree. An example of MTCS is Google®'s AlphaGo.

In some arrangements, the pixelated image (e.g., the pixilated dashboards 220 and 300) can be displayed to an operator operating the simulation system 100. The layout of the pixelated image is sufficiently intuitive and user-friendly such that the operator can immediately understand the basis for the actuator commands generated by the AI driver. In some arrangements, each pixelated image (e.g., each frame) can be stored in a suitable database with corresponding actuator commands to allow later review of the simulated environment as portrayed in each pixelated image and the corresponding actuator commands without having to rerun the simulation. Accordingly, computational efficiency can be improved.

In some arrangements, the simulation system 100 may be a part of a physical AV, where the simulation system 100 can assist the AV in making a driving decision based on simulating various possible outcomes corresponding to various possible driving decisions. For example, the processing circuit 110 can be a processing circuit on the AV, such that at least the controlled system 120, the dynamic simulation module 140, the environment simulation module 150, the measurement module 160, and the modification module 170 are implemented with hardware located on the AV. In some arrangements, performing the simulation for training the AI driver and assisting the AV in making driving decisions as the AV is on the road can be performed simultaneously.

Figure 7:
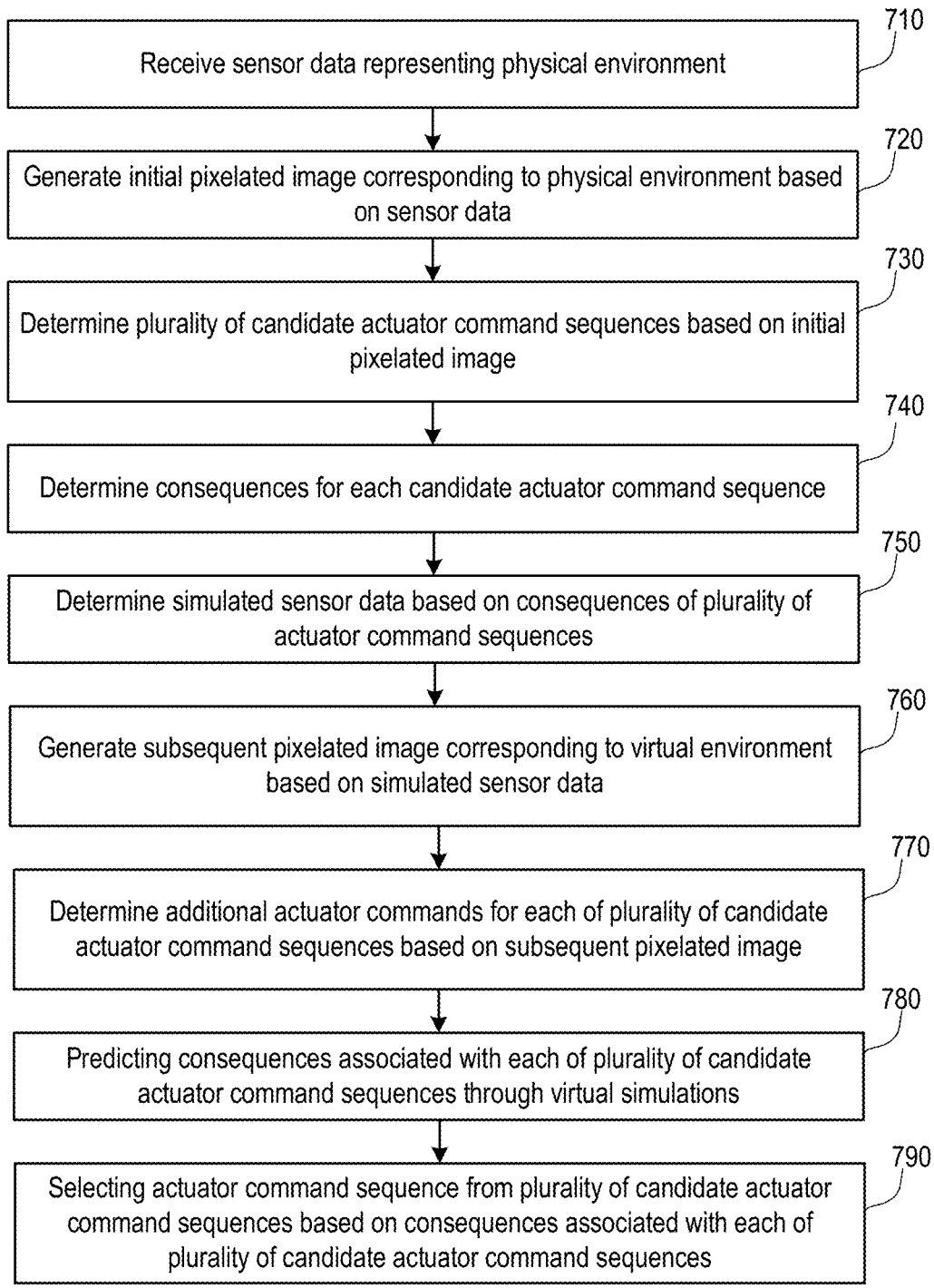
FIG. 7 is a process flow diagram illustrating an example of a method for simulating and improving performance of an AI driver according to various arrangements.

In such arrangements, the virtual environment is not provided by the environment database 135, and is instead generated based on the actual environment perceived by various actual sensors of the AV. In that regard, FIG. 7 is a process flow diagram illustrating an example of a method 700 for simulating and improving performance of an AI driver based on physical sensor data according to various arrangements.

At 710, the method 700 is initialized with receiving sensor data representing a physical environment. The sensor data can be received from physical sensors (e.g., cameras, LIDAR, GPS, wireless communication devices, and the like) on the AV. In that regard, the sensor module 122 is operatively coupled to those physical sensors to receive the sensor data. In some arrangements, the physical sensors sample the physical environment for a sampling duration (e.g., 2 s, 5 s, 10 s, and the like) to determine information such as velocity (speed and direction) of dynamic objects. At 720, at least one initial pixelated image can be generated to correspond to the physical environment based on the sensor data. For example, the perception module 124 uses the physical sensor data as input to generate the at least one initial pixelated image.

At 730, the candidate actuator command sequence generator of the decision module 126 determines a plurality of candidate actuator command sequences based on the at least one initial pixelated image in a manner similar to block 630. The ego vehicle object represents the physical AV. At 740, consequences associated with each of the plurality of candidate actuator command sequences are predicted through virtual simulations by the decision module 126 in a manner similar to block 640. For example, the dynamic simulation module 140 is configured to determine a first predicted consequence parameter indicative of consequences of the actuator command sequences on the ego vehicle object (the physical AV embodied in the virtual simulation). The environment simulation module 150 is configured to determine a second predicted consequence parameter indicative of consequences of the actuator command sequences on the virtual environment (which corresponds to the physical environment perceived by physical sensors of the AV).

At 750, the perception module 124 determines simulated sensor data based on the consequences of the plurality of actuator command sequences. Using the first predicted consequence parameter and the second predicted consequence parameter, the perception module 124 determines the simulated sensor data, which define a simulated, virtual environment in a predicted state. In other words, the virtual environment at this point no longer reflects the physical environment in which the AV physically is, although the virtual environment is generated based on actual sensor data.

At 760, the perception module 124 generates at least one subsequence pixelated image corresponding to the virtual environment (defined by the simulated sensor data) based on the simulated sensor data in the manner described. At 770, the candidate actuator command sequence generator of the decision module 126 determines additional actuator commands for each of the plurality of candidate actuator command sequences based on the at least one subsequent pixelated image. In that regard, at least one subsequent pixelated image can be generated for each candidate actuator command sequence. The at least one subsequent pixelated image is indicative of the consequences associated with that particular candidate actuator command sequence.

At 780, the consequences associated with each of the plurality of candidate actuator command sequences (with the additional actuator commands added to each candidate actuator command sequence) are predicted through virtual simulations by the decision module 126. At 790, an actuator command sequence is selected, by the decision module 126, from the plurality of candidate actuator command sequences based on the consequences associated with each of the plurality of candidate actuator command sequences in a manner similar to block 650. The actuator module 128 can be coupled to aspects of the physical AV such as but not limited to, an engine, transmission, steering, a gas tank, brakes, signal lights, and the like to actuate the selected actuator command sequence.

In some arrangements, the candidate actuator commands form a tree. In some examples, the simulation starts with, for example, a first predetermined number (e.g., 3) of candidate actuator commands. For each candidate command, the simulation computes a second predetermined number (e.g., 3) of subsequent candidate commands. This an N number of candidate sequences, where N equals to the first predetermined number multiplied by the second predetermined number. In the non-limiting example in which both the first predetermined number and the second predetermined number are 3, N is 9. Block 790 corresponds to identifying the best outcome among N candidate sequences.

As such, the plurality of candidate actuator commands are determined based on both physical sensor data received at 710 as well as simulated sensor data determined at 750. The actuator commands in a given candidate actuator command sequence that are executed first in time are determined based on the physical sensor data. The additional actuator commands in the candidate actuator command sequence that are executed subsequently are added to the sequence based on the simulated sensor data.

Figure 8:
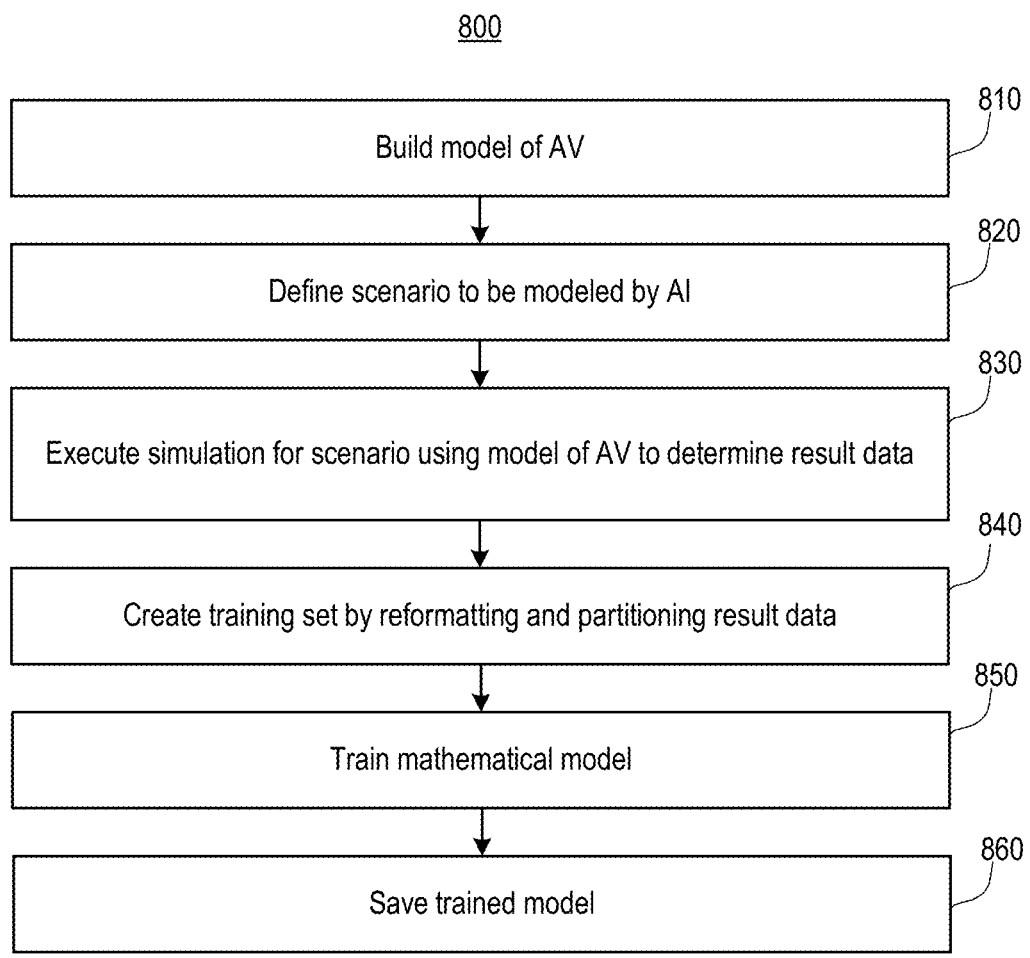
FIG. 8 is a process flow diagram illustrating an example of a method for training an AI driver according to various arrangements.

FIG. 8 is a process flow diagram illustrating an example of a method 800 for training an AI driver according to various arrangements. Referring to FIGS. 1-8, the methods 800 generally relates to offline training of a simplified model using simulation techniques.

At 810, the processing circuit 110 can implement a modeler that builds a model of an AV. The model includes parameters defining a current state (e.g., current position, current orientation, current velocity, and the like) and parameters defining possible actions of the AV (stop at an intersection during yellow light or accelerate through the intersection during the yellow light). The current state can be defined in 3-dimensional space, for example, using Cartesian coordinate system or another suitable coordinate system. The current state can also include first and second derivatives of those parameters. For example, acceleration is a second derivative of position and orientation. The model may be an Adams™ model which specifies differential equations or different representations, of the same AV. A CAD model can be converted to an Adams™ model by adding information required to formulate equations of motion, which is not specified in a CAD model.

At 820, the modeler implemented by the processing circuit 110 can define a scenario to be modeled by the AI. The scenario relate to various driving decisions or actuator commands. In one example, a decision whether to brake or swerve to avoid a bicycle or a braking vehicle in front can be a scenario. In another example, a decision whether to brake in front of a yellow light or to proceed through the intersection can be a scenario.

At 830, the processing circuit 110 can implement a simulator to execute a simulation using the model of the AV and the scenario to determine result data. The simulation can be a FEA simulation or a MBD simulation. The result data refers to log files or FEA post-processing results. In some arrangements, FEA can be used to simulate scenarios related to collisions. FEA simulations can also determine, for example, behaviors of tires when the AV is making a turn with a pothole under the tire.

At 840, the processing circuit 110 can implement a training circuit to create a training set by reformatting and partitioning the result data. The training set may include various training examples. A training example includes two steps (e.g., two rows) in the log file separated by a number of known time steps. For example, two adjacent steps differ by one time step, and are thus in adjacent rows. The result data is formatted as a Comma Separated Values (CSV). The result data can be partitioned for various reasons including but are not limited to, cross-validation partitioning, vehicle configuration partitioning, and the like. With respect to cross-validation partitioning, the result data can be partitioned into a number (e.g., 10) of partitions. A number (e.g., 9) of the partitions can be selected randomly or pseudo-randomly for training. The remaining partition can be selected for testing. With respect to vehicle configuration partitioning, two examples originating from two different AV configurations in the same model are avoided. For example, a fully loaded truck behaves differently from an empty truck. The AI may train a separate model for a fully loaded truck as supposed to an empty truck. A weight sensor on the AV can provide weight data, based on which the processing circuit 110 can determine which model to use.

At 850, the processing circuit 110 can train the simplified model. The simplified model can be trained using machine learning algorithms such as but not limited to, scikit learn, neural network training, and the like. At 860, the trained simplified model is saved to a suitable database or the memory 114.

Figure 9:
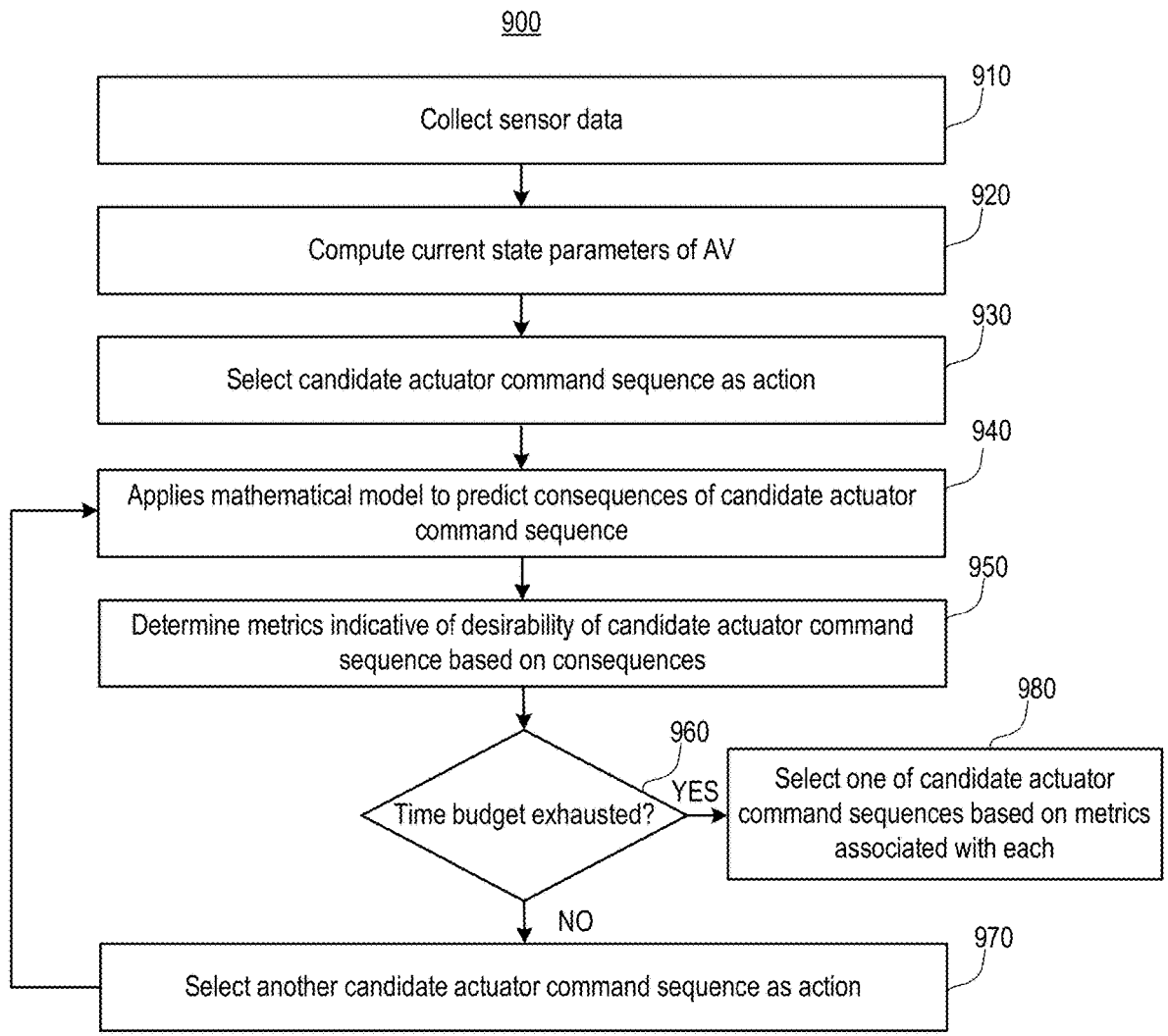
FIG. 9 is a process flow diagram illustrating an example of a method for training an AI driver according to various arrangements.

FIG. 9 is a process flow diagram illustrating an example of a method 900 for training an AI driver according to various arrangements. Referring to FIGS. 1-9, the method 900 follows the method 800 and predicts the consequences of actuator commands based on the simplified model provided by the method 800.

At 910, the sensor module 122 collects sensor data. The sensor data can be actual sensor data or simulated sensor data. At 920, current state parameters of the AV (e.g., the ego vehicle object) can be computed by the perception module 124. In some arrangements, a user can designate one or more objects and current state parameters associated therewith via a user interface of the simulation system 100.

At 930, the decision module 126 selects one of the plurality of candidate actuator command sequences as an action. The section can be based on the scenario for the virtual environment, or a user can specify the candidate actuator command sequence via the user interface. At 940, the decision module 126 applies the simplified model to predict the consequence of the candidate actuator command sequence in the manner described.

At 950, the decision module 126 determines metrics indicative of desirability of the candidate actuator command sequence based on the consequences. The metrics include but are not limited to, a safety quotient, a path tracking parameter, a comfort parameter, a fuel economy parameter, a duration of drive parameter, and the like.

At 960, the decision module 126 determines whether a time budget has been exhausted. In some examples, the time budget is a common concept in real-time systems. A real-time system has a control loop, which reads input from sensors, makes decisions based on the sensor output, and completes actuator commands. A single iteration of the control loop is to be completed within a predetermined time interval (e.g., 10 ms). The time budget refers to the time needed for an iteration of the control loop to be completed.

The simplified model is used to predict consequences of the plurality of candidate command sequences by implementing a control loop (e.g., blocks 930-960). When the time spent on those predictions reach a limit designated by the iteration time, the prediction stops, and the best candidate command sequence is selected. That best sequence of candidate actions is regarded as the recommended course of action. In some cases, only the best candidate command sequence is executed, followed by another search for a second best candidate command sequence. This is possible if the search is sufficiently fast. In other cases, a few actions can be executed so as to allow the subsequent searches more time, across multiple iterations.

The term "real time" refers to the guarantee to complete an iteration in a given time. The term "real time" does not refer to a fast iteration. In other words, an iteration that is completed within an entire minute, or an hour, or a day, could be "real time" as well, as long as there is a guarantee. In practice, the concept is used for fast reaction, e.g., checking the radar for potential collision every 10 ms, thus completing 100 iterations per second.

Response to determining that the time budget has not exhausted (960:NO), another candidate actuator command sequence of the plurality is selected at 970. The method returns to 940, forming the controlled loop. On the other hand, in response to determining that the time budget has exhausted (960:YES), the decision module 126 selects one of the candidate actuator command sequences based on the metrics associated with each candidate actuator command sequence.

The terms "system," "logic," "module," "data processing apparatus," or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary examples are illustrative only. Although only a few examples have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. Other substitutions, modifications, changes, and omissions can be made in the design, operating conditions and arrangement of the exemplary examples without departing from the scope of the present disclosure.

The present disclosure contemplates methods, systems and program products on any machine-readable media for accomplishing various operations. The examples of the present disclosure can be implemented using existing computer processors, or by a special purpose computer processor for an appropriate system, incorporated for this or another purpose, networked systems or by a hardwired system. Examples within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium.

Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions can be executed on any type of computing device (e.g., computer, laptop, etc.) or can be embedded on any type of electronic device (e.g., a portable storage device such as a flash drive, etc.).

Although the figures can show a specific order of method steps, the order of the steps can differ from what is depicted. Also, two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision step.

What is claimed is:

1. A simulation system for training an Artificial Intelligence (AI) driver configured to operate an Automated Vehicle (AV), comprising:
   a memory; and
   a processing circuit, wherein the processing circuit is configured to implement a controlled system corresponding to an ego vehicle object associated with the AV, the controlled system comprises, a sensor module, a perception module, a decision module, and an actuator module, wherein:
      the sensor module generates sensor data corresponding to a virtual environment;
      the perception module generates a pixelated image corresponding to the virtual environment based on the sensor data;
      the decision module determines actuator commands responsive to pixels in the pixelated image, wherein the decision module determines the actuator commands based on the AI driver; and
      the actuator module simulates behaviors of the ego vehicle object using the actuator commands, wherein the pixelated image comprises a pixelated graphical depiction of metrics, the metrics comprise at least one of a safety quotient, a path tracking parameter, a comfort parameter, a fuel economy parameter, and a duration of drive parameter.

2. The simulation system of claim 1, further comprises an environment provision module configured to provide a simulated environment based on which the sensor data is generated by the sensor module.

3. The simulation system of claim 1, wherein the pixelated image is a pixilated dashboard that comprises at least one of:
   a pixelated graphical depiction of at least one of a static temporal clearance parameter and a dynamic temporal clearance parameter;
   a pixelated graphical depiction of at least one traffic indicator;
   a pixelated graphical depiction of a simulated environment, wherein the simulated environment comprises at least one of visibility, traction, and weather information;
   a pixelated graphical depiction of a speed of the ego vehicle object; and
   a pixelated graphical depiction of alerts.

4. The simulation system of claim 3, wherein the perception module translates a list of numbers representative of the speed of the ego vehicle object into the pixelated graphical depiction of the speed.

5. The simulation system of claim 1, wherein the perception module generates the pixelated image by determining, based on the sensor data, at least one of a velocity of the ego vehicle object, distance from the ego vehicle object to at least one traffic participant object, relative velocity to at least one traffic participant object, and traffic indicators.

6. The simulation system of claim 1, wherein the sensor data is simulated sensor data.

7. The simulation system of claim 1, wherein the sensor data is physical sensor data received from physical sensors of the AV.

8. A simulation system for training an Artificial Intelligence (AI) driver configured to operate an Automated Vehicle (AV), comprising:
a memory; and
a processing circuit, wherein the processing circuit is configured to implement a controlled system corresponding to an ego vehicle object associated with the AV, the controlled system comprises, a sensor module, a perception module, a decision module, an actuator module, a dynamic simulation module, an environment simulation module, a measurement module, and a modification module, wherein:
the sensor module generates sensor data corresponding to a virtual environment;
the perception module generates a pixelated image corresponding to the virtual environment based on the sensor data;
the decision module determines actuator commands responsive to pixels in the pixelated image, wherein the decision module determines the actuator commands based on the AI driver;
the actuator module simulates behaviors of the ego vehicle object using the actuator commands
the dynamic simulation module determines a first predicted consequence parameter indicative of consequences of the actuator commands on the ego vehicle object;
the environment simulation module determines a second predicted consequence parameter indicative of consequences of the actuator commands on the virtual environment;
the measurement module determines an overall predicted consequence parameter based on the first predicted consequence parameter and the second predicted consequence parameter; and
the modification module modifies the AI driver to improve the overall predicted consequence parameter.

9. A method for training an Artificial Intelligence (AI) driver configured to operate an Automated Vehicle (AV), comprising:
generating sensor data corresponding to a virtual environment;
generating a pixelated image corresponding to the virtual environment based on the sensor data;
determining actuator commands responsive to pixels in the pixelated image, wherein the actuator commands are determined based on the AI driver; and
simulating behaviors of the ego vehicle object using the actuator commands, wherein the pixelated image comprises a pixelated graphical depiction of metrics, the metrics comprise at least one of a safety quotient, a path tracking parameter, a comfort parameter, a fuel economy parameter, and a duration of drive parameter.

10. A non-transitory computer-readable medium storing processor-readable instructions such that, when executed, causes a processor to train an Artificial Intelligence (AI) driver configured to operate an Automated Vehicle (AV) by:
generating sensor data corresponding to a virtual environment;
generating a pixelated image corresponding to the virtual environment based on the sensor data;
determining actuator commands responsive to pixels in the pixelated image, wherein the actuator commands are determined based on the AI driver; and
simulating behaviors of the ego vehicle object using the actuator commands, wherein the pixelated image comprises a pixelated graphical depiction of metrics, the metrics comprise at least one of a safety quotient, a path tracking parameter, a comfort parameter, a fuel economy parameter, and a duration of drive parameter.

11. A method for improving an AI driver in a simulated virtual environment, the method comprising:
generating pixelated images using sensor data corresponding to a virtual environment;
storing result parameters of simulations involving the AI driver managing an ego vehicle object, wherein the result parameters are generated based on the pixelated images;
organizing the result parameters into inputs and outputs;
deriving a simplified model that reproduces the outputs based on the inputs; and
applying the simplified model to perform subsequent simulations.

12. The method of claim 11, wherein:
the inputs comprise at least one of steering manipulation, acceleration pedal manipulation, and deceleration pedal manipulation; and
the outputs comprise at least one of chassis acceleration, velocity of the ego vehicle object, and displacement of the ego vehicle object.

13. The method of claim 11, wherein deriving the simplified model comprises performing a Finite Element Method (FEM) analysis using, as input, discretized material properties of at least one of a vehicle represented by the ego vehicle object and a human passenger, to compute injury parameters to the human passenger as output, wherein the discretized material properties are visualized as images.

14. The method of claim 11, wherein deriving the simplified model comprises performing a Finite Element Method (FEM) analysis to compute distortion to the ego vehicle object due to additive manufacturing.

15. The method of claim 11, wherein deriving the simplified model comprises performing a flexible body analysis.

16. The method of claim 11, further comprising:
limiting a number of log files corresponding to the results parameters stored; and
determining an impact to the number of log files due to a change in the simplified model.

17. The method of claim 11, wherein deriving the simplified model comprises at least one of:
automatically selecting a kernel method from a plurality of kernel methods for deriving the simplified model;
automatically selecting a model from a plurality of models based on simulation criteria; and
deriving the simplified model using Mixture of Experts.

18. A simulation system for training an Artificial Intelligence (AI) driver configured to operate an Automated Vehicle (AV), comprising:

a memory; and a processing circuit, wherein the processing circuit is configured to:

generate pixelated images using sensor data corresponding to a virtual environment;

store result parameters of simulations involving the AI driver managing an ego vehicle object, wherein the result parameters are generated based on the pixelated images;

organize the result parameters into inputs and outputs;

derive a simplified model that reproduces the outputs based on the inputs; and apply the simplified model to perform subsequent simulations.

19. A non-transitory computer-readable medium storing processor-readable instructions such that, when executed, causes a processor to train an Artificial Intelligence (AI) driver configured to operate an Automated Vehicle (AV) by:

generating pixelated images using sensor data corresponding to a virtual environment;

storing result parameters of simulations involving the AI driver managing an ego vehicle object, wherein the result parameters are generated based on the pixelated images;

organizing the result parameters into inputs and outputs;

deriving a simplified model that reproduces the outputs based on the inputs; and applying the simplified model to perform subsequent simulations.

20. A method for training an Artificial Intelligence (AI) driver configured to operate an Automated Vehicle (AV), comprising:

generating, by a sensor module, sensor data representing a virtual environment;

generating, by a perception module, a pixelated image corresponding to the virtual environment based on the sensor data;

determining, by a candidate actuator command sequence generator, a plurality of candidate actuator command sequences based on the pixelated image, wherein each of the plurality of candidate actuator command sequences controls an ego vehicle object;

predicting consequences associated with each of the plurality of candidate actuator command sequences through virtual simulations; and selecting an actuator command sequence from the plurality of candidate actuator command sequences based on the consequences associated with each of the plurality of candidate actuator command sequences.

21. The method of claim 20, wherein the consequences associated with each of the plurality of candidate comprises:

consequences on the ego vehicle object determined by a control system simulator; and consequences on the virtual environment determined by an environment simulator.

22. The method of claim 21, further comprising:

determining a level of confidence for the consequences on the virtual environment based on uncertainties in the virtual environment;

determining factors present in the virtual environment to evaluate accuracy of the sensor data; and measuring the virtual environment to determine parameterization of the virtual environment.

23. The method of claim 20, wherein selecting one of the plurality of candidate actuator command sequences comprises:

measuring, by a consequence measurement module, desirability associated with the consequences associated with each of the plurality of candidate actuator command sequences; and selecting, by a command sequence selection module, one of the plurality of candidate actuator command sequences based on the desirability associated with the consequences associated with each of the plurality of candidate actuator command sequences.

24. The method of claim 23, wherein the desirability is measured using at least one of a safety quotient, a path tracking parameter, a comfort parameter, a fuel economy parameter, and a duration of drive parameter.

25. The method of claim 20, selecting one of the plurality of candidate actuator command sequences comprises:

ranking the plurality of candidate actuator command sequences based on the consequences associated with each of the plurality of candidate actuator command sequences;

generating a tree that minimizes backtracking during selecting;

grouping sequences that share a number of subsequences above a threshold; and select one of the plurality of candidate actuator command sequences using a Monte Carlo Tree Search (MCTS) based on the tree.

26. The method of claim 20, wherein the virtual simulations are performed by learning reduced order models or performed using error-models associated with physical sensors.

27. A simulation system for training an Artificial Intelligence (AI) driver configured to operate an Automated Vehicle (AV), comprising:

a memory; and a processing circuit, wherein the processing circuit is configured to:

generate sensor data representing a virtual environment;

generate a pixelated image corresponding to the virtual environment based on the sensor data;

determine a plurality of candidate actuator command sequences based on the pixelated image, wherein each of the plurality of candidate actuator command sequences controls an ego vehicle object;

predict consequences associated with each of the plurality of candidate actuator command sequences through virtual simulations; and select an actuator command sequence from the plurality of candidate actuator command sequences based on the consequences associated with each of the plurality of candidate actuator command sequences.

28. A non-transitory computer-readable medium storing processor-readable instructions such that, when executed, causes a processor to train an Artificial Intelligence (AI) driver configured to operate an Automated Vehicle (AV) by:

generating sensor data representing a virtual environment;

generating a pixelated image corresponding to the virtual environment based on the sensor data;

determining a plurality of candidate actuator command sequences based on the pixelated image, wherein each of the plurality of candidate actuator command sequences controls an ego vehicle object;

predicting consequences associated with each of the plurality of candidate actuator command sequences through virtual simulations; and selecting an actuator command sequence from the plurality of candidate actuator command sequences based on the consequences associated with each of the plurality of candidate actuator command sequences.

29. A method for training an Artificial Intelligence (AI) driver configured to operate an Automated Vehicle (AV), comprising:
  generating sensor data corresponding to a virtual environment;
  generating a pixelated image corresponding to the virtual environment based on the sensor data;
  determining actuator commands responsive to pixels in the pixelated image, wherein the actuator commands are determined based on the AI driver;
  simulating behaviors of the ego vehicle object using the actuator commands determining a first predicted consequence parameter indicative of consequences of the actuator commands on the ego vehicle object;
  determining a second predicted consequence parameter indicative of consequences of the actuator commands on the virtual environment;
  determining an overall predicted consequence parameter based on the first predicted consequence parameter and the second predicted consequence parameter; and
  modifying the AI driver to improve the overall predicted consequence parameter.

30. A non-transitory computer-readable medium storing processor-readable instructions such that, when executed, causes a processor to train an Artificial Intelligence (AI) driver configured to operate an Automated Vehicle (AV) by:
  generating sensor data corresponding to a virtual environment;
  generating a pixelated image corresponding to the virtual environment based on the sensor data;
  determining actuator commands responsive to pixels in the pixelated image, wherein the actuator commands are determined based on the AI driver;
  simulating behaviors of the ego vehicle object using the actuator commands determining a first predicted consequence parameter indicative of consequences of the actuator commands on the ego vehicle object;
  determining a second predicted consequence parameter indicative of consequences of the actuator commands on the virtual environment;
  determining an overall predicted consequence parameter based on the first predicted consequence parameter and the second predicted consequence parameter; and
  modifying the AI driver to improve the overall predicted consequence parameter.

* * * * *